United States Patent [19]
Henley et al.

[11] Patent Number: 6,103,599
[45] Date of Patent: Aug. 15, 2000

[54] PLANARIZING TECHNIQUE FOR MULTILAYERED SUBSTRATES

[75] Inventors: Francois J. Henley, Los Gatos; Nathan Cheung, Albany, both of Calif.

[73] Assignee: Silicon Genesis Corporation, Los Gatos, Calif.

[21] Appl. No.: 09/089,931

[22] Filed: Jun. 3, 1998

Related U.S. Application Data

[60] Provisional application No. 60/053,770, Jul. 25, 1997.

[51] Int. Cl.$^7$ ...................................................... H01L 21/00
[52] U.S. Cl. ......................... 438/459; 438/458; 438/977; 438/694; 438/770
[58] Field of Search ..................................... 438/528, 459, 438/974, 977, 766, 770, 697, 745, 756, 723, 513, 455, 458, 406, 4, 694

[56] References Cited

U.S. PATENT DOCUMENTS

| | | | |
|---|---|---|---|
| 4,006,340 | 2/1977 | Gorinas | 219/121 P |
| 4,566,403 | 1/1986 | Fournier | 118/718 |
| 4,846,928 | 7/1989 | Dolins et al. | 156/626 |
| 4,847,792 | 7/1989 | Barna et al. | 364/552 |

(List continued on next page.)

FOREIGN PATENT DOCUMENTS

| | | |
|---|---|---|
| 0 379 828 | 12/1989 | European Pat. Off. . |
| 0 459 177 | 5/1991 | European Pat. Off. . |
| 0193904 | 11/1984 | Japan . |
| 2231197 | 3/1990 | United Kingdom . |

OTHER PUBLICATIONS

Lee et al "A Novel Pattern Transfer Process for Bonded SOI Giga–Bit DRAM", 1996 IEEE International SOI Proceeding, Sep. 30–Oct. 3, 1996, pp. 114–115.

Lu et al "SOI Material Technology Using Plasma Immersion Ion Implantation", Proceedings 1996 IEEE International Conference, Oct. 1996 pp. 48–49.

Chu et al Synthesis of SOI Materials Using Plasma Immersion Ion Implantations, Materials Research Society Symp Proceeding vol. 438, 1997 Material Research Society pp. 333–343.

Burggraaf, Pieter, "Advanced Plasma Sources: What's Working?," *Semiconductor International*, pp. 56–59 (May 1984).

*Primary Examiner*—Savitri Mulpuri
*Attorney, Agent, or Firm*—Townsend and Townsend and Crew LLP

[57] ABSTRACT

The present invention provides a multilayered wafer 10 such as an SOI wafer having a novel implanted layer. This implanted layer is removable and provides a resulting wafer having a substantially uniform surface. The wafer includes a bulk substrate 11 and an insulating layer 13 formed overlying the bulk substrate 15. A film of semiconductor material is formed overlying the insulating layer. Surface non-uniformities are formed overlying and in the film of semiconductor material. The non-uniformities are implanted, and are bordered by a substantially uniform interface 17 at a selected depth underlying the surface non-uniformities. The substantially uniform interface provides a substantially uniform resulting surface for the SOI wafer.

28 Claims, 4 Drawing Sheets

U.S. PATENT DOCUMENTS

| | | | |
|---|---|---|---|
| 4,853,250 | 8/1989 | Boulose et al. | 427/34 |
| 4,887,005 | 12/1989 | Rough et al. | 315/111.21 |
| 4,948,458 | 8/1990 | Ogle | 154/643 |
| 4,952,273 | 8/1990 | Popov | 156/643 |
| 4,960,073 | 10/1990 | Suzuki et al. | 118/723 MR |
| 4,996,077 | 2/1991 | Moslehi et al. | 427/38 |
| 5,010,579 | 4/1991 | Henley et al. | 438/350 |
| 5,013,563 | 5/1991 | Henley et al. | 438/974 |
| 5,015,353 | 5/1991 | Hubler et al. | 427/527 |
| 5,133,826 | 7/1992 | Dandl | 156/345 |
| 5,202,095 | 4/1993 | Houchin et al. | 422/186 |
| 5,203,960 | 4/1993 | Dandl | 156/643 |
| 5,234,529 | 8/1993 | Johnson | 156/345 |
| 5,250,328 | 10/1993 | Otto | 427/535 |
| 5,252,178 | 10/1993 | Moslehi | 156/643 |
| 5,273,610 | 12/1993 | Thomas, III et al. | 156/345 |
| 5,342,472 | 8/1994 | Imahashi et al. | 156/345 |
| 5,368,710 | 11/1994 | Chen et al. | 204/192.32 |
| 5,370,765 | 12/1994 | Dandl | 156/643 |
| 5,374,564 | 12/1994 | Bruel | 438/766 |
| 5,404,079 | 4/1995 | Ohkuni et al. | 315/111.81 |
| 5,405,480 | 4/1995 | Benzing et al. | 156/345 |
| 5,411,592 | 5/1995 | Ovshinsky et al. | 250/288 |
| 5,435,880 | 7/1995 | Minato et al. | 156/345 |
| 5,487,785 | 1/1996 | Horiike et al. | 118/723 E |
| 5,504,328 | 4/1996 | Bonser | 250/288 |
| 5,593,622 | 1/1997 | Lee et al. | 438/458 |
| 5,822,987 | 3/1999 | Srikrishnan | 438/977 |
| 5,920,764 | 7/1999 | Hanson et al. | 438/977 |

PLANARIZING TECHNIQUE FOR MULTILAYERED SUBSTRATES

This application claims the benfit of U.S. Provisional Application No. 60/053,770, filed Jul. 25, 1997, the disclosure of which is incorporated by reference.

BACKGROUND OF THE INVENTION

The present invention relates to the manufacture of integrated circuits. More particularly, the present invention provides a technique for planarizing substrates using a novel implanting technique. This invention is illustrated using, for example, silicon-on-insulator wafers, but can be applied to other types of substrates.

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs.

Some integrated circuits are fabricated on a slice or wafer, of single-crystal (monocrystalline) silicon, commonly termed a "bulk" silicon wafer. Devices on such "bulk" silicon wafer typically are isolated from each other. A variety of techniques have been proposed or used to isolate these devices from each other on the bulk silicon wafer, such as a local oxidation of silicon ("LOCOS") process, trench isolation, and others. These techniques, however, are not free from limitations. For example, conventional isolation techniques consume a considerable amount of valuable wafer surface area on the chip, and often generate a non-planar surface as an artifact of the isolation process. Either or both of these considerations generally limit the degree of integration achievable in a given chip. Additionally, trench isolation often requires a process of reactive ion etching, which is extremely time consuming and can be difficult to achieve accurately.

An approach to achieving very-large scale integration ("VLSI") or ultra-large scale integration ("ULSI") is by using a semiconductor-on-insulator ("SOI") wafer. An SOI wafer typically has a layer of silicon on top of a layer of an insulator material. A variety of techniques have been proposed or used for fabricating the SOI wafer. These techniques include, among others, growing a thin layer of silicon on a sapphire substrate, bonding a layer of silicon to an insulating substrate, and forming an insulating layer beneath a silicon layer in a bulk silicon wafer. In an SOI integrated circuit, essentially complete device isolation is often achieved using conventional device processing methods by surrounding each device, including the bottom of the device, with an insulator. An advantage SOI wafers have over bulk silicon wafers is that the area required for isolation between devices on an SOI wafer is less than the area typically required for isolation on a bulk silicon wafer.

SOI offers other advantages over bulk silicon technologies as well. For example, SOI offers a simpler fabrication sequence compared to a bulk silicon wafer. Devices fabricated on an SOI wafer may also have better radiation resistance, less photo-induced current, and less cross-talk than devices fabricated on bulk silicon wafers. Many problems, however, that have already been solved regarding fabricating devices on bulk silicon wafers remain to be solved for fabricating devices on SOI wafers.

Numerous limitations still exist with the use of SOI wafers for the fabrication of integrated circuits. For example, devices within integrated circuits in SOI wafers are very sensitive to the presence of even minute concentrations of some impurities. For example, metals, such as copper, nickel, silver, gold, or iron, within the active region of a device typically degrade several device characteristics, including leakage current and breakdown voltage. These and other metals rapidly diffuse through silicon at temperatures typical of semiconductor device fabrication processes. These impurities often become trapped in the active region of the SOI wafer. That is, the SOI wafer includes a dielectric layer or insulating layer underlying the active region that tends to keep impurities in the active layer, rather than diffusing down into the bulk silicon. Accordingly, SOI wafers are prone to device and reliability problems caused by the presence of impurities that cannot diffuse out of the active region.

SOI wafers generally must also be polished to remove any surface irregularities from the film of silicon overlying the insulating layer. Polishing generally includes, among others, chemical mechanical polishing, commonly termed CMP. CMP is generally time consuming and expensive, and can be difficult to perform cost efficiently to remove surface non-uniformities. That is, a CMP machine is expensive and requires large quantities of slurry mixture, which is also expensive.

Furthermore, the film of silicon on the insulator layer is often polished by way of polishing techniques such as chemical mechanical polishing and others. Polishing is often required to clean the silicon surface and remove any non-uniformities therefrom. Polishing, however, is extremely time consuming and expensive. Polishing also introduces the wafer to a slurry mixture, which can be highly acidic or caustic. Accordingly, the slurry mixture can influence functionality and reliability of devices that are fabricated on the SOI wafer.

From the above, it is seen that an improved technique for manufacturing a substrate such as an SOI wafer is highly desirable.

SUMMARY OF THE INVENTION

According to the present invention, a technique including a method and device for removing surface non-uniformities and impurities from a substrate such as an SOI wafer is provided. In an exemplary embodiment, the technique uses a novel implanting step to provide an implanted layer with surface roughness that can be planarized. Planarization occurs by way of processing steps such as oxidation and selective removal of the non-uniform film.

In a specific embodiment, the present invention provides a method for fabricating a substrate such as a silicon-on-insulator wafer using a novel implanting step, which enhances film uniformity. The method uses a step of providing a semiconductor substrate, which includes a thickness of material having a surface. The surface of the semiconductor substrate includes non-uniformities or "roughness" formed from, for example, a detachment process, that is, the non-uniformities can be made by way of a process such as a controlled cleaving process, or a process called Smart Cut™, or any others. The thickness of material has a volume defined by the surface and a selected depth, which has a substantially uniform surface at the selected depth. The thickness of material is also characterized by implant damage (e.g., structural, change in material property) which extends from the surface to the selected depth. The thickness of material is converted into an insulating material such as silicon dioxide at least up to the selected depth. The insulating material is selectively removed (e.g., wet or dry etching) from the semiconductor substrate to provide a substantially uniform surface overlying the semiconductor substrate.

In an alternative specific embodiment, the present invention provides a substrate such as an SOI wafer having a novel implanted layer to provide a uniform surface on the wafer. The wafer includes a bulk substrate and an insulating layer formed overlying the bulk substrate. A film of semiconductor material is formed overlying the insulating layer. Surface non-uniformities (e.g., roughness) are formed overlying a thickness of material in the film. The thickness of material has a volume defined by a selected depth, which has a substantially uniform planar surface at that selected depth. The thickness of material is characterized by implant damage, which extends from the surface to the selected depth. This implant damaged thickness of material can be removed by way of oxidation and selective etching techniques, thereby leaving a substantially uniform surface.

In still a further embodiment, the present invention generally provides a method and resulting (and intermediary) structures for planarizing a substrate or film overlying the substrate (e.g., silicon wafer). The substrate or film includes a thickness of material having surface non-uniformities or roughness. Particles are implanted into the thickness of material through the surface non-uniformities to a selected depth, which has a substantially planar surface. The implanted thickness of material includes damage therein, e.g., structural or change in composition. The thickness of material is converted into another material such as an oxide layer, which can be selectively removed by processing techniques such as etching or the like. By way of selective removal of the implanted thickness of material, a substantially planar surface remains on the film of material or the substrate.

Numerous benefits are achieved using the present invention over pre-existing techniques. For example, the present invention provides an efficient technique for forming a substantially uniform surface on an SOI wafer. Additionally, the substantially uniform surface is made by way of common oxidation and etching techniques. Furthermore, the present invention provides a novel non-uniform layer, which can act as a gettering layer for removing impurities from to be active regions of the SOI wafer. These and other benefits are described throughout the present specification and more particularly below.

These and other embodiments of the present invention, as well as other advantages and features are described in more detail in conjunction with the text below and attached Figs.

DESCRIPTION OF SPECIFIC EMBODIMENTS

According to the present invention, a technique including a method and device for removing surface non-uniformities on a surface(s) of a substrate such as an SOI wafer is provided. In exemplary embodiments, the technique also removes impurities from the bulk material of the SOI wafer, as well as removing surface roughness and non-uniformities. More particularly, the invention uses an implanting technique, which causes implant damage to a thickness of material having surface "roughness," where the thickness of material is later selectively removed, thereby leaving a substantially uniform surface on the SOI wafer. The SOI wafer is made by way of a variety of techniques including a "blister" process such as Smart Cut™ or preferably a controlled cleaving process.

Figure 1:
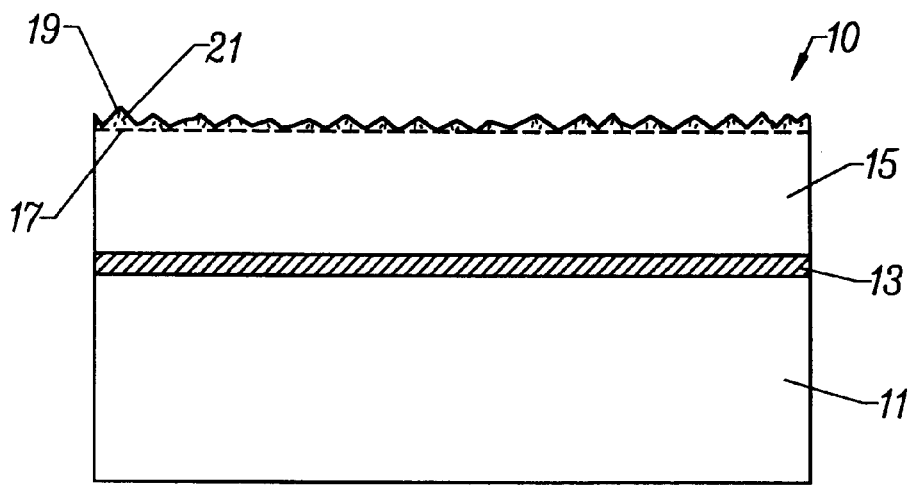
FIG. 1 is a simplified cross-sectional view diagram of an SOI wafer having a non-uniform surface.

FIG. 1 is a simplified cross-sectional view diagram of a partially completed SOI wafer 10 having an implanted material region according to the present invention. This diagram is merely an illustration and should not limit the scope of the claims herein. One of ordinary skill in the art would recognize other modifications, alternatives, and variations.

The SOI wafer 10 is a partially completed wafer, which has a novel implanted layer 21. Among other elements, the SOI wafer includes a bulk substrate 11, which can be made of a variety of materials such as silicon, glass, and others. Overlying the bulk substrate 11 is an insulating layer 13, which is often made of oxide, but can also be other materials such as silicon nitride, multi-layered materials, and the like. A film of semiconductor material 15 (e.g., single crystal silicon) overlies the insulating layer 13.

The semiconductor material 15 includes an implanted layer 21, which can have a lower material density than the bulk of the semiconductor material 15. As shown, the implanted layer includes an interface region defined by the dotted line and shown by reference numeral 17. This interface region is a substantially uniform plane relative to the bulk of semiconductor material. Additionally, average density of the region overlying the interface region shown by reference numeral 17 is less than average density of the material in the bulk region 15. By way of different properties of layer 21 and layer 15, layer 21 can be selectively removed by way of a variety of semiconductor processing techniques such as etching, and others. In a specific embodiment, the implanted layer 21 is oxidized into a silicon dioxide layer, but can be converted to other materials. By removing the implanted layer 21 having non-uniformities, a fully planarized and substantially uniform substrate surface 17 can be made according to the present invention.

In preferred embodiments, the implanted layer can also remove impurities by way of a gettering action from the bulk semiconductor material region 15, as well as other regions. These impurities include, among others, metals such as copper, nickel, silver, gold, or iron, and other mobile particles, which migrate within the semiconductor material region 15. With enhanced diffusion at elevated temperatures, impurities are trapped in the implanted layer by way of the rough or implanted structure. Alternatively, the type of material of the implanted layer attracts and holds impurities into the layer. The implanted layer therefore acts as a gettering layer for impurities, which become trapped in the implanted layer. These impurities can be eliminated by removing the implanted layer from the semiconductor material by way of selective etching and other fabrication techniques. Details of these fabrication techniques for this partially completed substrate, as well as completed fully planarized substrates are discussed below.

FIGS. 2–7 are simplified diagrams of a method for fabricating the above SOI wafer according to the present invention. These diagrams are merely illustrations and should not limit the scope of the claims herein. One of ordinary skill in the art would recognize other modifications, alternatives, and variations. The present invention provides a novel implanted layer, which can be removed, thereby leaving a substantially uniform SOI wafer, as well as eliminate impurities from active regions subsequently formed in the SOI wafer.

Figure 2:
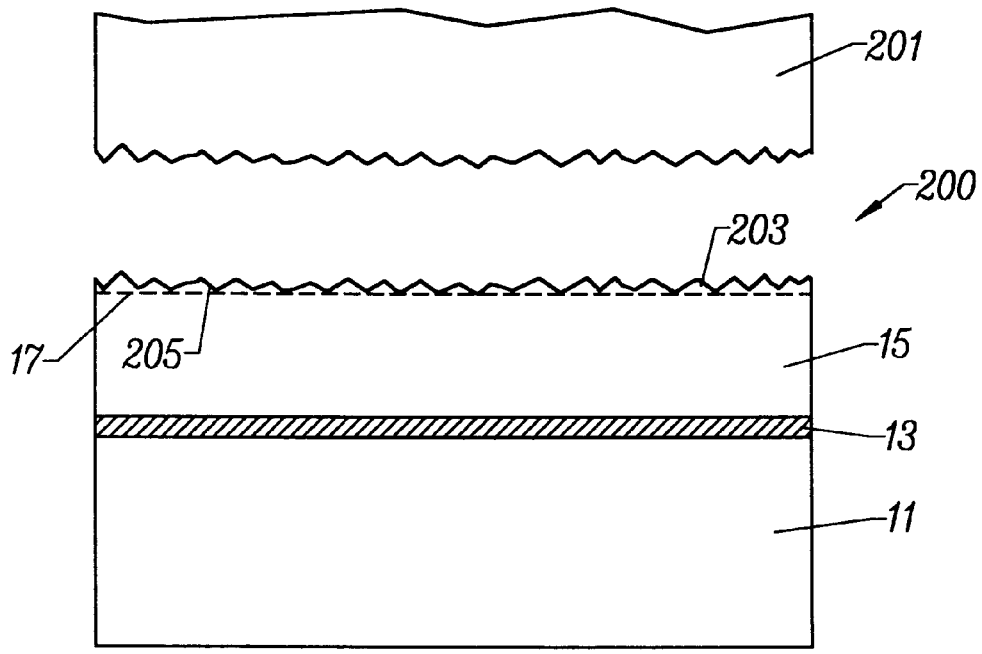
FIGS. 2–7 are simplified cross-sectional view diagrams of the above SOI wafer according to the present invention.

A variety of techniques can be used to form the implanted layer and rough surface on the SOI wafer, for example. FIG. 2 shows a simplified illustration of a cleaving or cut process, which effectively removes a portion 201 of a donor wafer from a thin film of detached material 15. Depending upon the type of cleaving or cut process, surface 205 can be relatively non-uniform and have imperfections thereon, as shown. For example, donor substrate portion 201 is removed by way of a blister technique commonly termed Smart Cut™. An example of this blister technique for removing film material 15 from donor substrate portion 201 is described in U.S. Pat. No. 5,374,564, entitled, Process For The Production Of Thin Semiconductor Material Films, by Michel Bruel, issued Dec. 20, 1994 (the "Bruel" patent). The Bruel patent generally describes a process for globally raising the temperature of an implanted wafer to blister a film off of a wafer by way of expanding microbubbles. This technique can often form non-uniformities 205 or surface roughness and imperfections in the wafer surface, as shown. Additionally, the blister process produces a non-uniform layer, which has lateral and vertical roughness or non-uniformities. The non-uniformities must be removed before beginning the fabrication of active integrated circuit devices in the SOI wafer. The blister process forms implant damaged layer 203, which has a substantially uniform interface region 17. This uniform interface region is formed by way of the vertical straggle of the ion implant process used for a Smart Cut™.

In an alternative specific embodiment, an implanted layer 303 including the surface roughness can be made by way of a controlled cleaving process. This process allows an initiation of a cleaving process on a substrate using a single or multiple cleave region(s) through the use of controlled energy (e.g., spatial distribution) and selected conditions to allow an initiation of a cleave front(s) and to allow it to propagate through the substrate to remove a thin film of material 15 from the substrate. The process is described in Henley et al, entitled A CONTROLLED CLEAVAGE PROCESS AND RESULTING DEVICE, filed May 12, 1997 ("Henley") (Attorney Docket No. 18419-000100) and hereby incorporated by reference for all purposes. The controlled cleaving process provides a more uniform surface on the film as compared to the blister method described by Bruel, noted above. Additionally, the controlled cleaving process produces a uniform layer, which has limited lateral roughness that can be removed using the present technique. The controlled cleaving process also forms implant damaged layer 203, which has a substantially uniform interface region 17. This uniform interface region is formed by way of the straggle of the ion implant or plasma immersion implant process used for the controlled cleaving process.

Figure 3:
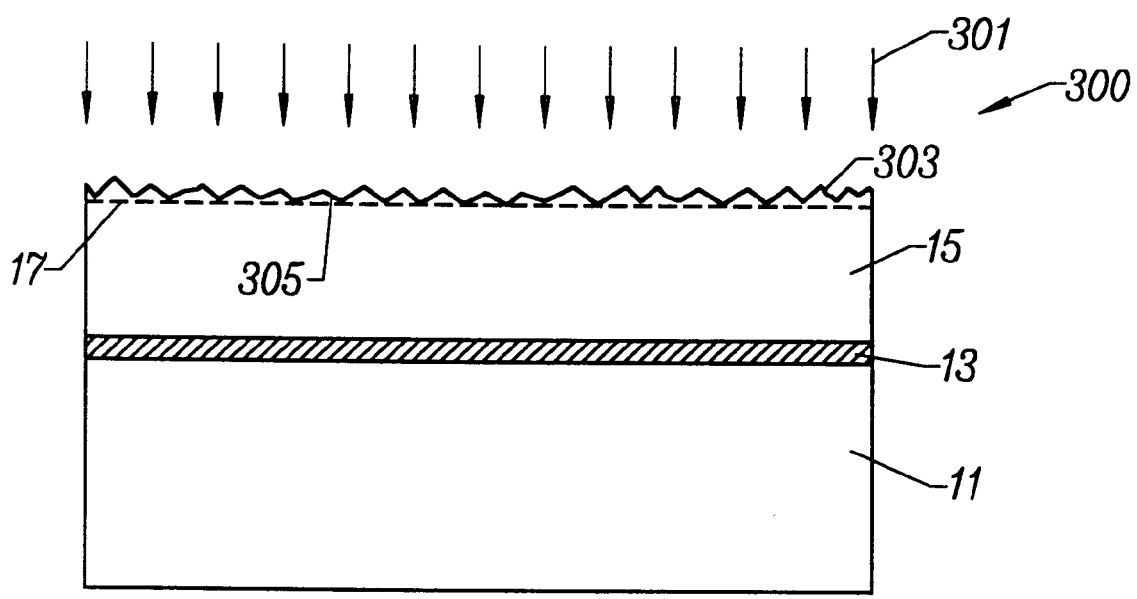

In still a further alternative embodiment, the implanted layer having the non-uniform surface is made by lower energy implantation of a non-uniform film, as shown by FIG. 3. As shown, a substrate 300, which includes the film of material 15, includes surface roughness or non-uniformities 305. Energetic impurities or particles 301 can be introduced into the film of material 15 using one of numerous techniques. These techniques include beam line ion implantation, plasma immersion ion implantation, and others. The energetic particles cause implant damage to the film of material 303 having the surface non-uniformities 305. As merely an example, the energetic particles include, among other materials, charged (positive or negative) and/or neutral atoms or molecules, or electrons, or the like. In a specific embodiment, the particles can be neutral and/or charged particles including ions such as H+ ions, rare gas ions such as helium and its isotopes, and neon, and deuterium. The particles can also be derived from compounds such as gases, e.g., hydrogen gas, water vapor, methane, hydrides, and hydrogen compounds, and other atomic mass particles. Alternatively, the particles can be any combination of the above particles, and/or ions and/or molecular species and/or atomic species. The particles generally have sufficient kinetic energy to enter into material 15 to create the implanted layer 303 having a substantially uniform interface 17. The substantially uniform interface is enhanced when the lateral straggle of the implant is greater than the characteristic size of the surface roughness.

Figure 3A:
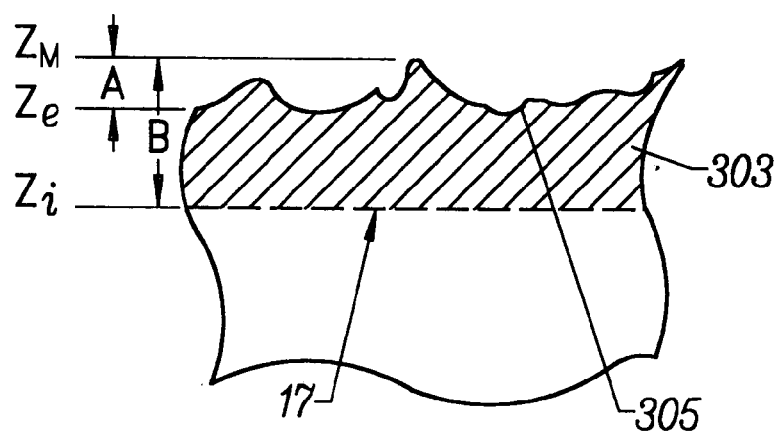

FIG. 3A is a more detailed diagram of FIG. 3 (or a detailed diagram similar to FIG. 2). This diagram is merely an illustration and should not limit the scope of the claims herein. One of ordinary skill in the art would recognize other variations, alternatives, and modifications. As shown, the implanted layer 303 includes the interface 17 at $(z_i)$, which is substantially uniform from the vertical straggle and the lateral straggle of the implant. The surface roughness 305 has an outer region defined at $(z_n)$ and an inner region defined by $(z_l)$. In most embodiments, the distance (defined by reference letter A) between the outer region and the inner region is less than the distance (defined by reference letter B) between the outer region and the interface. In a specific embodiment, the distance B is at least 1.0 or 1.5 times the distance A. Alternatively, the distance B is at least 2 times the distance A. Alternatively, the distance B is at least 3 times the distance of A. Of course, the particular relative distances will depend upon the application. An explanation of implant straggle is explained in, for example, C. J. John Peng and N. W. Cheung, "Two Dimensional Implantation Profile Simulator—RETRO," Nuclear Instrum. Methods, Vol. B74, pp. 222–225 (1993), which is hereby incorporated by reference.

Figure 4:
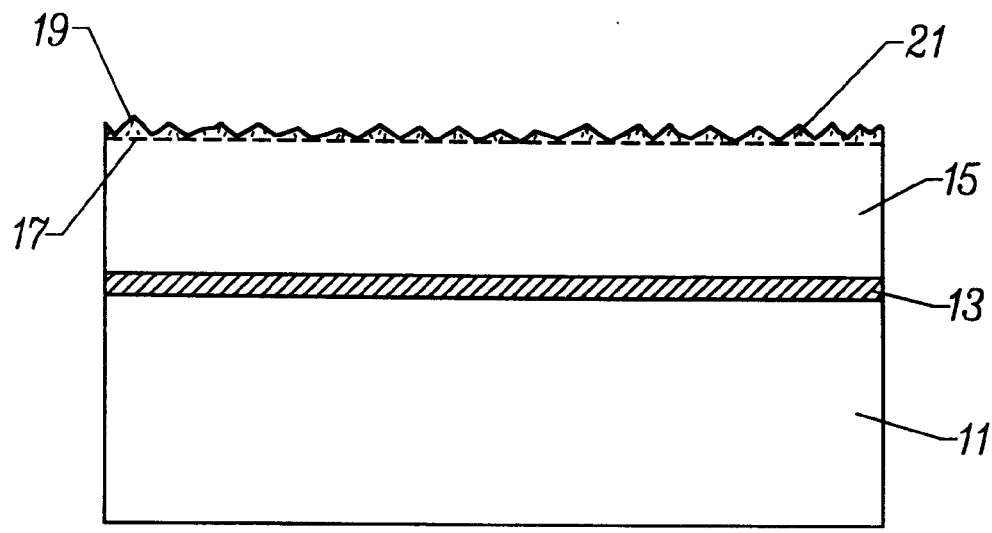

After forming a film (e.g., 303) having implanted surface non-uniformities such as anyone of the above SOI substrates, the material comprising the implanted surface non-uniformities is converted into another material, as illustrated by FIG. 4, for example. That is, the implanted surface non-uniformities made by silicon can be converted into silicon dioxide by way of an oxidation process. Oxidation occurs in a thermal annealing furnace using either oxygen or steam. Thermal annealing converts the implanted surface non-uniformities made of silicon into silicon dioxide. As shown, the surface includes non-uniformities 19 (or reference number 305 or 205) in the layer of silicon dioxide 21. A substantially uniform interface 17 is defined between the silicon dioxide 21 and silicon substrate material 15. The substantially uniform interface generally has a uniformity less than about 0.5% or more preferably less than about 0.3%.

Figure 5:
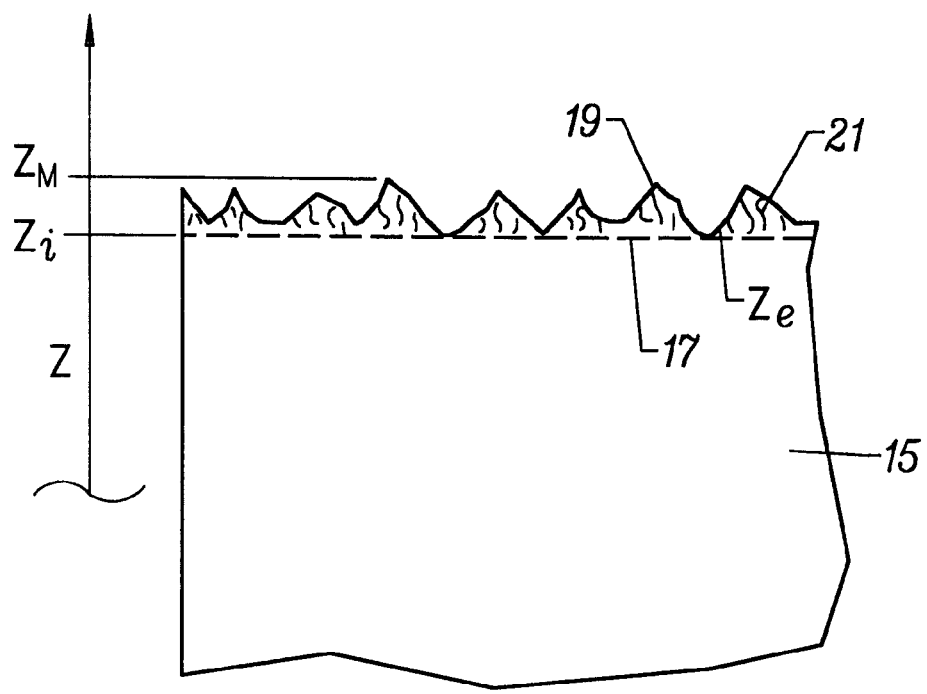
Figure 6:
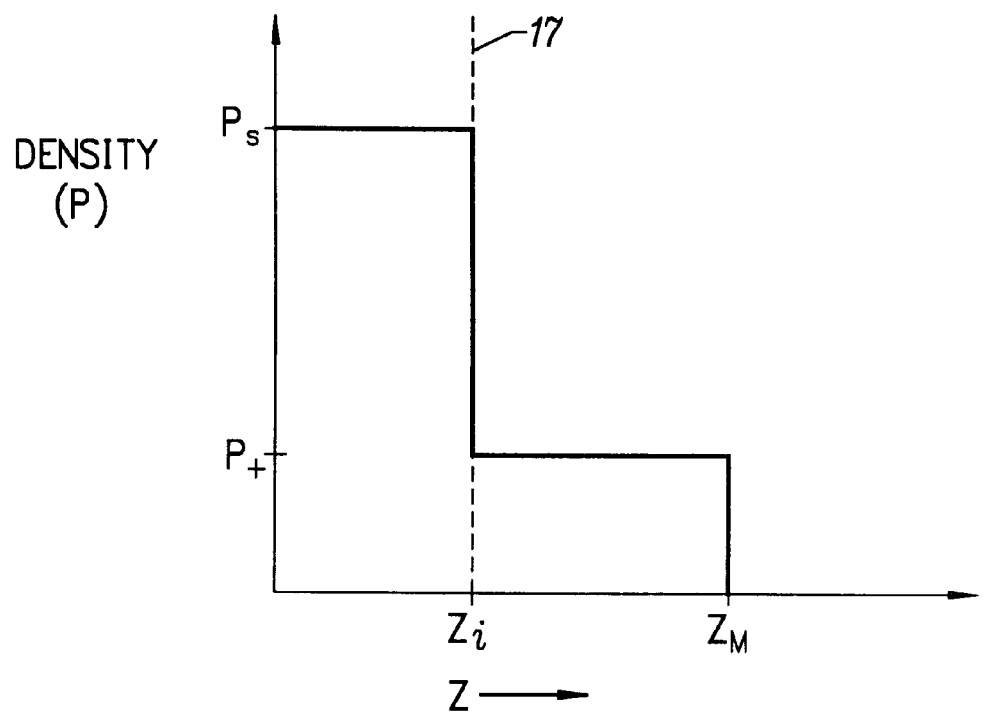

In order to better understand this technique of forming this substantially uniform interface 17, it may be helpful to describe the oxidation of silicon process in more detail using FIGS. 5 and 6. FIG. 5 is a more detailed diagram of FIG. 4, and FIG. 6 is a diagram illustrating a density of the non-uniform implanted layer in silicon before oxidation. Referring to FIG. 5, for example, the SOI wafer includes, among other elements, the film of material 15, the interface 17, and the silicon dioxide layer 21, which includes the surface non-uniformities 19. The interface layer is defined along a horizontal plane at $(z_i)$ and the surface has an upper height at $(z_m)$. The lower height is defined by $(z_l)$. As shown, the silicon dioxide layer, which is previously silicon, converts into silicon dioxide, leaving a substantially uniform interface 17 in the silicon dioxide 21 layer, which is defined as the film of silicon 15.

Before converting the silicon into silicon dioxide, the surface non-uniformities are implanted. By way of implanting, which causes implant damage, the density of the region having the non-uniformities is less than the density of the bulk silicon material. To illustrate the difference in densities between the implanted layer and the bulk silicon material, FIG. 6 is provided. As shown, the vertical axis represents the density of the materials, where $\rho_s$ represents the density of the bulk substrate and $\rho_t$ represents the density of the implanted layer. As shown, the density of the bulk substrate is greater than the density of the implanted layer. At the interface region ($z_i$), the density of the substrate structure decreases to the density of the implanted layer until a lateral distance ($z_m$), which is defined as the outer most point of the surface non-uniformities. This difference in densities allows oxygen molecules or ions to diffuse through and react with the implanted layer at a much faster rate than the diffusion of oxygen into the bulk silicon material. Since the diffusion or mass transfer rate of the oxygen is faster through the implanted layer, the oxygen converts substantially all of the silicon in the implanted layer into silicon dioxide before beginning to convert any of the silicon in the bulk substrate, which has a higher density. By way of limitations in mass transfer rates in the bulk silicon layer, oxidation of the bulk silicon layer essentially stops or slows down to a point where the interface 17 region forms in a substantially uniform manner.

In a specific embodiment, the oxidized (or implanted) non-uniform layer also works as a gettering layer. For example, the non-uniform layer includes a surface roughness and an interface region, which can attract and trap impurities, that migrate in the subsequently formed active regions of the SOI wafer. Accordingly, the non-uniform layer can accumulate impurities such as metal contaminates from the active region. These impurities can be eliminated as the non-uniform layer is removed. This removal process is described in more detail below.

Figure 7:
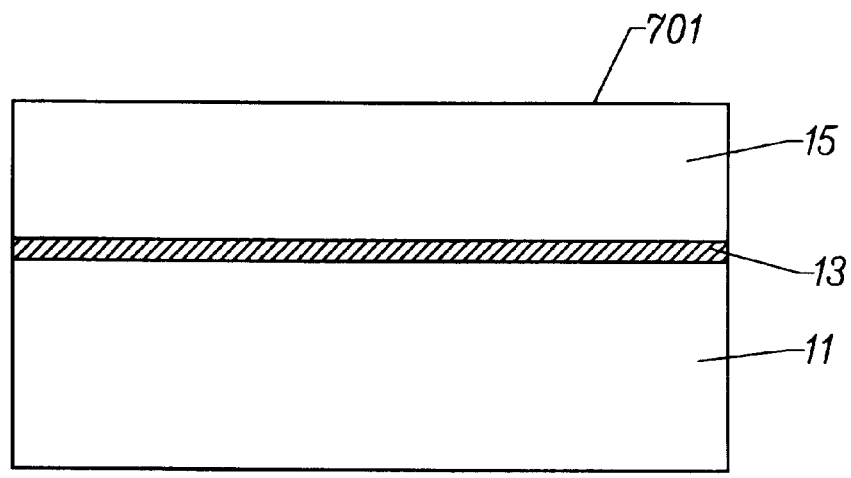

Subsequent to oxidation of the non-uniform implanted layer, a selective removal process can be used to remove the non-uniform implanted layer from the bulk substrate 15, as shown in FIG. 7. For example, since the non-uniform implanted layer is made of oxide and the bulk substrate is made of silicon, a selective etchant can be used to selectively remove the oxide from the bulk silicon substrate. As merely an example, the selective etchant can include a variety of solutions such as hydrofluoric acid or the like, if a wet process is desired. Alternatively, the oxide can be selectively removed by way of a plasma etching or reactive ion etching or a plasma immersion process. Using a plasma process, an etchant includes, among other materials, a fluorine bearing compound(s), e.g., $CF_4$, $SF_6$. Of course, the type of etchant used will depend upon the application.

The etching process selectively removes the non-uniformities from the material region to leave a substantially uniform surface 701, for example. This substantially uniform surface has a surface uniformity less than about 0.5%, or less than about 0.3% and lower, if needed. Preferably, the selective removal process is used with the controlled cleaving process, which generally provides a detached surface that is more uniform than those made by way of the blister technique such as Smart Cut™ and others.

In an alternative embodiment, a final polishing step can be performed before using the wafer for integrated circuit processing. For example, the detached surface of the film of silicon material can be slightly rough and may need finishing, which occurs using a combination of grinding and/or polishing techniques. In some embodiments, the detached surface undergoes a step of grinding using, for examples, techniques such as rotating an abrasive material overlying the detached surface to remove any imperfections or surface roughness therefrom. A machine such as a "back grinder" made by a company called Disco may provide this technique.

Alternatively, chemical mechanical polishing or planarization techniques finish the detached surface of the film. In CMP, a slurry mixture is applied directly to a polishing surface which is attached to a rotating platen. This slurry mixture can be transferred to the polishing surface by way of a metering pump, which is coupled to a slurry source. The slurry is often a solution containing an abrasive and an oxidizer, e.g., $H_2O_2$, $KIO_3$, ferric nitrate. The abrasive is often a borosilicate glass, titanium dioxide, titanium nitride, aluminum oxide, aluminum trioxide, iron nitrate, cerium oxide, silicon dioxide (colloidal silica), silicon nitride, silicon carbide, graphite, diamond, and any mixtures thereof. This abrasive is mixed in a solution of deionized water and oxidizer or the like. Preferably, the solution is acidic. Of course, the technique used to completely finish the surface of the wafer depends upon the application.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for fabricating a substrate, said method comprising steps of:

providing a substrate comprising a thickness of material having a non-uniform surface, said thickness of material being implant damaged and having a substantially planar interface region at a selected depth underying said non-uniform surface;

converting said implant damaged thickness of material that is at a lower density up to said substantially planar interface region into an insulating material; and selectively removing said insulating material from said substrate using at least an etching process to expose said substantially uniform interface region to provide a substantially uniform surface;

wherein said separation process is provided by a Smart Cut™ process or controlled cleaving process.

2. The method of claim 1 wherein said implant damaged thickness of material has a lower density than said substrate.

3. The method of claim 1 wherein said insulating material is an oxide material.

4. The method of claim 1 wherein said step of converting is an oxidation step.

5. The method of claim 4 wherein said converting step converts said implant damaged thickness of material into an oxide material.

6. The method of claim 1 wherein said implant damaged thickness of material is made using a process selected from beam ion implantation, PIII, or separation.

7. The method of claim 1 wherein said implant damaged thickness of material is made by way of implantation.

8. The method of claim 1 wherein said non-uniform surface is made by a cut process.

9. The method of claim 1 wherein said etching process is a selective plasma etching process.

10. The method of claim 1 wherein said etching process is a wet etching process.

11. The method of claim 10 wherein said wet etching process is a hydrofluoric acid dip.

12. The method of claim 1 wherein said substrate is a silicon wafer.

13. The method of claim 12 wherein said converting step decomposes said implant damaged thickness of material into an oxide layer, said oxide layer having said substantially uniform interface region to single crystalline silicon.

14. The method of claim 1 wherein said converting step also removes a possible impurity from said substrate, said impurity being trapped in said implant damaged thickness of material.

15. A method for planarizing a surface of a silicon-on-insulator semiconductor substrate, said method comprising steps of:

provuding a semconductor substrate, said semiconductor substrate comprising a semiconductor material over a substrate material with an insulating layer sandwiched in between;

forming a thickness of material having implant damage that is at a lower density therein and surface non-uniformities thereon in said semiconductor material;

converting said thickness of material into an insulating material; and selectively removing said insulating material from said semiconductor material to provide a substantially uniform surface, said selective removing comprising an etching process;

wherein said separation is provided by a Smart Cut™ process or a controlled cleaving process.

16. The method of claim 15 wherein said thickness of material has a lower density relative to said semiconductor material.

17. The method of claim 15 wherein said insulating material is an oxide material.

18. The method of claim 15 wherein said step of converting is an oxidation step.

19. The method of claim 18 wherein said converting step changes said thickness of material into an oxide layer.

20. The method of claim 15 wherein said thickness of material is made using a process selected from ion implantation or separation of said semiconductor material.

21. The method of claim 15 wherein said thickness of material is implant damaged.

22. The method of claim 15 wherein said surface non-uniformities are surface roughness provided by a cut process.

23. The method of claim 15 wherein said etching process is a selective plasma etching process.

24. The method of claim 15 wherein said etching process is a wet etching process.

25. The method of claim 24 wherein said wet etching process is a hydrofluoric acid dip.

26. The method of claim 15 wherein said bulk substrate is a silicon wafer.

27. The method of claim 26 wherein said converting step decomposes said thickness of material into an oxide layer, said oxide layer having a substantially uniform interface to single crystalline silicon in said semiconductor material.

28. The method of claim 15 wherein said converting step also removes a possible impurity from said semiconductor material, said impurity being trapped in said thickness of material.

* * * * *

UNITED STATES PATENT AND TRADEMARK OFFICE
CERTIFICATE OF CORRECTION

PATENT NO. : 6,103,599
DATED : August 15, 2000
INVENTOR(S) : Henley, et al.

It is certified that error appears in the above-identified patent and that said Letters Patent is hereby corrected as shown below:

Column 8, claim 1,
Line 36, after "underlying said non-uniform surface" add -- , said implant damaged thickness of material being made using a separation process --.

Column 8, claim 6,
Line 57, after "implantation" delete "," and add -- or --; delete ", or separation".

Column 9, claim 15,
Line 20, after "non-uniformities thereon in said semiconductor material" add -- ,said thickness of material being made using a separation process --.

Column 10, claim 20,
Line 9, delete "or separation of said semiconductor material".

Signed and Sealed this

Thirteenth Day of November, 2001

Attest:

*Nicholas P. Godici*

NICHOLAS P. GODICI
*Attesting Officer*     *Acting Director of the United States Patent and Trademark Office*